(12) United States Patent
Cheng et al.

(10) Patent No.: US 11,747,174 B2
(45) Date of Patent: Sep. 5, 2023

(54) CAPACITIVE-SENSING ROTARY ENCODER

(71) Applicant: TEXAS INSTRUMENTS INCORPORATED, Dallas, TX (US)

(72) Inventors: Lichang Cheng, Shanghai (CN); Ziehen Qiu, Shanghai (CN); Songhua Hu, Shanghai (CN); Yang Li, Shanghai (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 172 days.

(21) Appl. No.: 17/326,936

(22) Filed: May 21, 2021

(65) Prior Publication Data
US 2022/0196442 A1    Jun. 23, 2022

Related U.S. Application Data

(63) Continuation of application No. PCT/CN2020/137605, filed on Dec. 18, 2020.

(30) Foreign Application Priority Data

Dec. 18, 2020 (WO) ................ PCT/CN2020/137605

(51) Int. Cl.
*G01D 5/241* (2006.01)
*G01R 27/26* (2006.01)

(52) U.S. Cl.
CPC ......... *G01D 5/2417* (2013.01); *G01D 5/2415* (2013.01); *G01D 5/241* (2013.01); *G01R 27/2605* (2013.01)

(58) Field of Classification Search
CPC ........ G01R 27/00; G01R 27/02; G01R 27/26; G01R 27/2605; G01D 5/00; G01D 5/12;
(Continued)

(56) References Cited

U.S. PATENT DOCUMENTS

| 4,563,683 A | 1/1986 | Tanaka et al. |
| 6,492,911 B1 * | 12/2002 | Netzer ................ G01D 11/245 340/870.37 |

(Continued)

FOREIGN PATENT DOCUMENTS

| CN | 103116424 A | 5/2013 |
| CN | 107860404 A | 3/2018 |

(Continued)

OTHER PUBLICATIONS

International Search Report for PCT/CN2020/137605 dated Sep. 21, 2021.

*Primary Examiner* — Hoai-An D. Nguyen
(74) *Attorney, Agent, or Firm* — Krista Y. Chan; Frank D. Cimino

(57) ABSTRACT

An apparatus is provided and includes a rotary encoder that comprises a stator, a rotor, and a controller. The stator has an opening adapted to surround a first portion of a rotatable shaft, a transmit region, and a receive region. The rotor has an opening adapted to surround a second portion of the rotatable shaft, an annular conductive region, and at least one conductor electrically coupled with the annular conductive region. The controller has an input coupled to the receive region and has an output coupled to the transmit region. The controller is configured to transmit a first signal on the output of the controller and to the transmit region of the stator, receive a second signal on the input of the controller and from the receive region of the stator, and determine, based on the second signal, a proximity of the at least one conductor to the receive region.

20 Claims, 8 Drawing Sheets

(58) Field of Classification Search
CPC ............ G01D 5/14; G01D 5/24; G01D 5/241;
G01D 5/2412; G01D 5/2415; G01D
5/2417; G01D 5/244; G01D 5/24471;
G01D 5/2449; G01F 15/00; G01F 15/07;
G01F 15/075
USPC .... 324/600, 649, 658, 663, 671, 686; 702/1,
702/33, 45, 47, 50, 52
See application file for complete search history.

(56) References Cited

U.S. PATENT DOCUMENTS

| | | | | |
|---|---|---|---|---|
| 7,126,495 | B2 * | 10/2006 | Netzer | ................. G01D 11/245 |
| | | | | 340/870.39 |
| 2018/0328762 | A1 | 11/2018 | Cheng et al. | |
| 2020/0284310 | A1 * | 9/2020 | Minamiura | ......... F16H 57/0479 |
| 2021/0189687 | A1 * | 6/2021 | Minamiura | ........... F16H 57/043 |

FOREIGN PATENT DOCUMENTS

| | | | | |
|---|---|---|---|---|
| CN | 105675027 B | * | 5/2019 | ........... G01D 5/2415 |
| JP | 2018136147 A | | 8/2018 | |
| RU | 200279 U1 | * | 10/2020 | ............... G01B 7/30 |
| WO | 2005046301 A2 | | 5/2005 | |
| WO | WO-2020255682 A1 | * | 12/2020 | ............. G01D 5/244 |

\* cited by examiner

CAPACITIVE-SENSING ROTARY ENCODER

BACKGROUND

Flow meters such as gas, water, and electric meters track an amount of fluid or energy that has flowed through the meter. The meter can utilize a manual indicator such as one or more number wheels to indicate the value of fluid or energy used since a starting value.

SUMMARY

In accordance with one aspect, an apparatus includes a rotary encoder that comprises a stator, a rotor, and a controller. The stator has an opening adapted to surround a first portion of a rotatable shaft, a transmit region located on a first concentric area of the stator, and a receive region located on a second concentric area of the stator. The second concentric area of the stator is separate from the first concentric area of the stator. The rotor has an opening adapted to surround a second portion of the rotatable shaft, an annular conductive region located on a first concentric area of the rotor, and at least one conductor electrically coupled with the annular conductive region and located on a second concentric area of the rotor. The second concentric area of the rotor is separate from the first concentric area of the rotor. The controller has an input coupled to the receive region and has an output coupled to the transmit region. The controller is configured to transmit a first signal on the output of the controller and to the transmit region of the stator, receive a second signal on the input of the controller and from the receive region of the stator, and determine, based on the second signal, a proximity of the at least one conductor to the receive region.

In accordance with another aspect, an apparatus comprises a rotatable shaft, a rotor coupled to a first portion of the rotatable shaft and a fixed substrate positioned adjacently to the rotor. The rotor comprises a central region located on a first concentric area of the rotor and at least one lobe coupled to and extending from the central region, the at least one lobe located on a second concentric area of the rotor. The fixed substrate has an opening surrounding the rotatable shaft, a transmit region configured to capacitively couple with the central region, and a capacitive sensor array configured to capacitively couple with the at least one lobe. The apparatus also comprises a controller electrically coupled with the transmit region and with the capacitive sensor array and configured to receive an output from the capacitive sensor array based a signal transmitted to the transmit region and determine an angular rotation of the rotor based on the output.

In accordance with another aspect, a method of manufacturing a rotary encoder comprises coupling a rotor to a rotatable shaft, positioning the rotor adjacently to a stator having an opening adapted to surround a second portion of the rotatable shaft, and coupling a controller to the transmit region and to the receive region. The rotor has an opening adapted to surround a first portion of the rotatable shaft, an annular conductive region located on a first concentric area of the rotor, and at least one conductor electrically coupled with the annular conductive region and located on a second concentric area of the rotor, the second concentric area separate from the first concentric area, The stator comprises a transmit region located on a first concentric area of the stator and a receive region located on a second concentric area of the stator, the second concentric area separate from the first concentric area. The controller is configured to transmit a first signal to the transmit region of the stator, receive a second signal from the receive region of the stator, and determine, based on the second signal, a proximity of the at least one conductor to the receive region.

DETAILED DESCRIPTION

Figure 1:
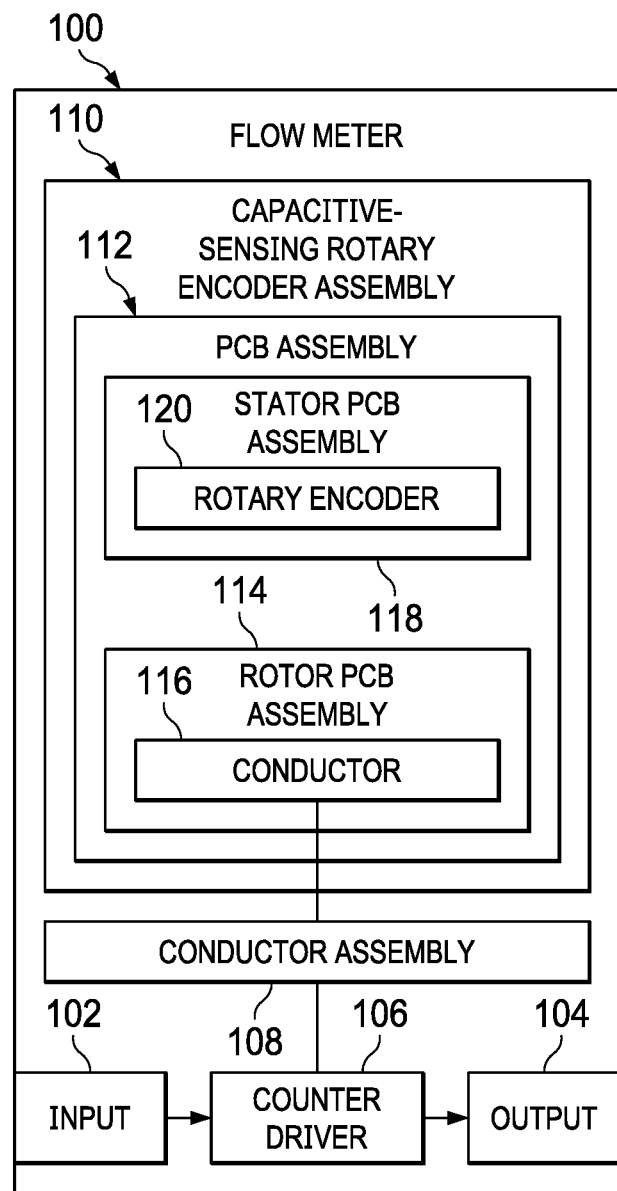
FIG. 1 is a block diagram of an example flow meter assembly having a capacitive-sensing rotary encoder assembly in accordance with this disclosure.

FIG. 1 is a block diagram of an example flow meter assembly 100 having an input 102 and an output 104. In a fluid-based flow meter, a fluid such as a liquid or a gas flows from the input 102 to the output 104 while the flow meter assembly 100 measures the quantity of fluid passing therethrough. Between the input 102 and the output 104, a counter driver 106 is positioned in flow communication with the fluid passing through the flow meter assembly 100. The counter driver 106 can include a mechanical conversion device to convert the fluid flowing therethrough or thereby into a rotary motion. For example, the counter driver 106 may include one or more gears configured to rotate in response to the fluid flow. In an electrical energy-based flow meter, an electrical current flowing between the input 102 and the output 104 causes an electrical-to-mechanical counter driver 106 to convert the electricity to a mechanical motion, rotating the one or more gears as a result.

A counter assembly 108 is coupled to the counter driver 106 to visually indicate a running total of the quantity of fluid or energy that has flowed through the flow meter assembly 100 since an initial value (e.g., zero). The counter assembly 108 may include one or more number wheels that rotate in response to the counter driver 106. The counter assembly 108 may be, for example, a decade counter having individual decimal number wheels having the numbers zero through nine imprinted along the circumferential surface of each wheel. The rotation axes of the number wheels are aligned with each other, and the wheels may be coupled in a manner that a full rotation of one wheel causes a partial rotation in an adjacent wheel. In this manner, a full rotation of a number wheel in the ones place causes the number wheel in the tenths place to rotate one-tenth of a rotation to its next number. Each successive wheel is coupled to the previous wheel in the same manner.

A capacitive-sensing rotary encoder assembly 110, in accordance with this disclosure, is coupled to the counter assembly 108. The capacitive-sensing rotary encoder assembly 110 includes a printed circuit board (PCB) assembly 112 including a rotor PCB assembly 114 having a conductor 116 implemented thereon and a stator PCB assembly 118 having a rotary encoder 120 implemented thereon. The rotor PCB assembly 114 includes a rotor PCB for each number wheel of the counter assembly 108, and each rotor PCB is configured to rotate simultaneously with its adjacent, corresponding number wheel.

The stator PCB assembly 118 includes a stator PCB for each rotor PCB of the rotor PCB assembly 114. As disclosed in more detail below, as each rotor PCB rotates relative it its corresponding stator PCB, the rotor PCB changes the capacitances of sensing capacitors of the stator PCB.

Figure 2:
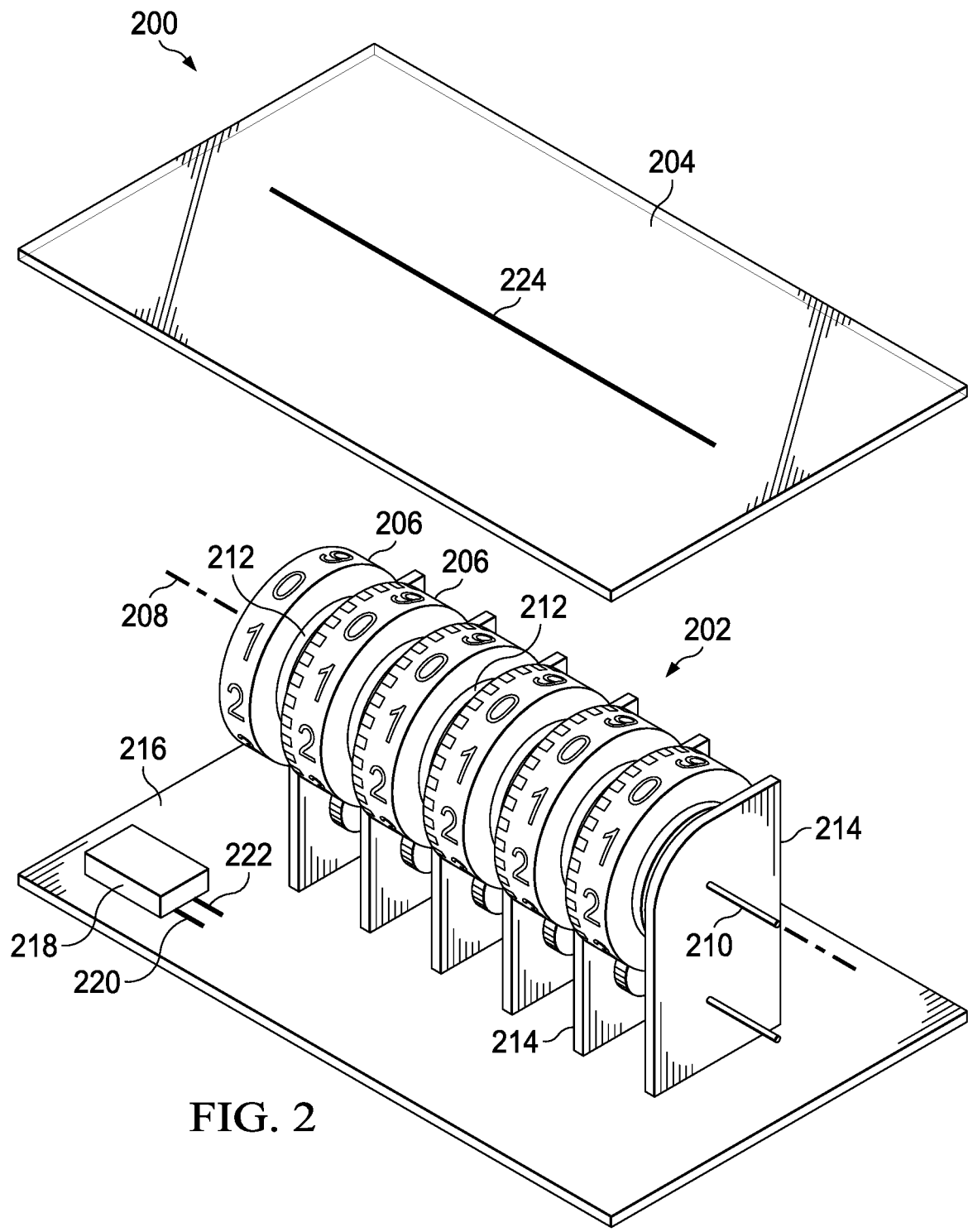
FIG. 2 is an isometric view of a portion of an example flow meter in accordance with this disclosure.

FIG. 2 is an isometric view of a portion of an example flow meter 200 according to an example. A counter assembly 202 and a view panel 204 of the flow meter 200 are shown. Counter assembly 202 includes a plurality of number wheels 206 arranged along a common rotation axis 208 about a shaft 210. In the illustrated example, six number wheels 206 are shown. However, more or fewer than six number wheels 206 are contemplated herein. The six number wheels 206 may have the same markings on the outer cylindrical surface thereof or may have distinct markings on one or more of the wheels 206. When marked with the numbers zero through nine, the counter assembly 202 may operate as a decade counter where each wheel 206 rotates ten revolutions for every revolution of its adjacent left neighbor.

A plurality of rotors 212 is attached to the plurality of number wheels 206, each rotor 212 coupled to rotate with a respective wheel 206. A plurality of stators 214 is provided, each stator 214 positioned adjacently to a respective rotor 212. A base or substrate 216 provides a support for the stators 214. According to an example of the disclosure, the rotors 212, the stators 214, and the base 216 are constructed of one or more PCB materials having electrical traces formed thereon.

Figure 3:
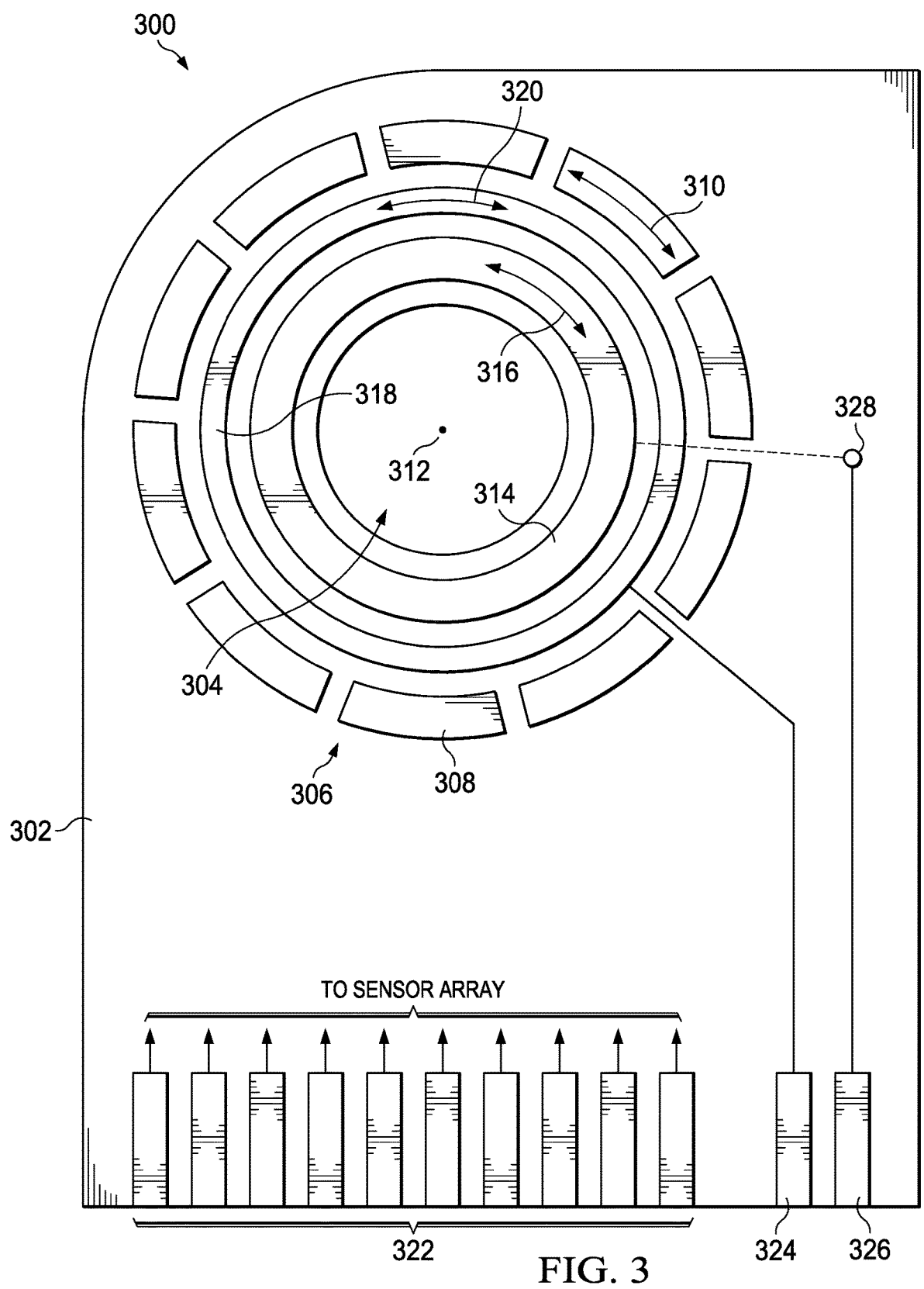
FIG. 3 is a schematic view of an example stator PCB in accordance with this disclosure.

FIG. 3 is a schematic view of an example stator PCB 300 according to an example. Stator PCB 300 may be used to implement the example rotary encoder 120 of FIG. 1 and includes a substrate 302 constructed of one or more PCB materials. An opening 304 in the substrate 302 can be provided to allow a shaft or other object to extend through the substrate 302 (see, e.g., FIG. 7).

The stator PCB 300 includes a circular capacitive sensor array 306 including a number of capacitive sensing regions or receive conductors (one of which is designated at reference numeral 308 for the example capacitive sensing array 306) arranged about a first concentric area 310 of the substrate 302. As shown, the capacitive sensing regions 308 within the capacitive sensor array 306 are angularly offset or separated from each other about a rotational axis 312 of the stator PCB 300 and are electrically decoupled from one another. The capacitive sensing regions 308 implement a receive region or a combined sensing capacitor for the capacitive sensor array 306. While the number of capacitive sensing regions 308 shown in FIG. 3 provide ten sensing regions for implementation in a decade counter, for example, the number of sensing regions 308 may include more or fewer regions to match the number of indicators on each wheel (e.g., number wheels 206 of FIG. 2), which may be more or less than ten.

The stator PCB 300 also includes a transmit region 314 arranged about a second concentric area 316 of the substrate 302 and a ground region 318 arranged about a third concentric area 320 of the substrate 302. In the illustrated example, the second concentric area 316 is closer to the opening 304 than the first concentric area 310, and the third concentric area 320 is between both the first and second concentric areas 310, 316. However, the first and second concentric areas 310, 316 may swap positions in another example.

The transmit region 314, the ground region 318, and capacitive sensing regions 308 of the capacitive sensor array 306 may be constructed of electrically conductive traces, pads, and/or areas on the substrate 302 such as copper or other PCB metallic trace material. Substrate 302 includes a number of sensor array contact pads 322, each pad 322 electrically coupled with a respective capacitive sensing region 308. Substrate 302 also includes a ground contact pad 324 electrically coupled with the ground region 318 and includes a transmit contact pad 326 electrically coupled with the transmit region 314. As illustrated, the regions 308, 314, 318 are formed on a same side of the substrate 302. The pads 322, 324, 326 may further be formed on the same side as shown, or some or all may be installed on the opposite side to accommodate trace routing or to accommodate the connector on the substrate 302 to which the pads 322, 324, 326 may be coupled/soldered. For example, six of the pads 322, 324, 326 shown may be formed on one side of the substrate 302, and the remaining six may be formed on the other side of the substrate 302. Furthermore, one or more vias 328 may be implemented to move any part of a trace to the opposite side of the substrate 302.

Figure 4:
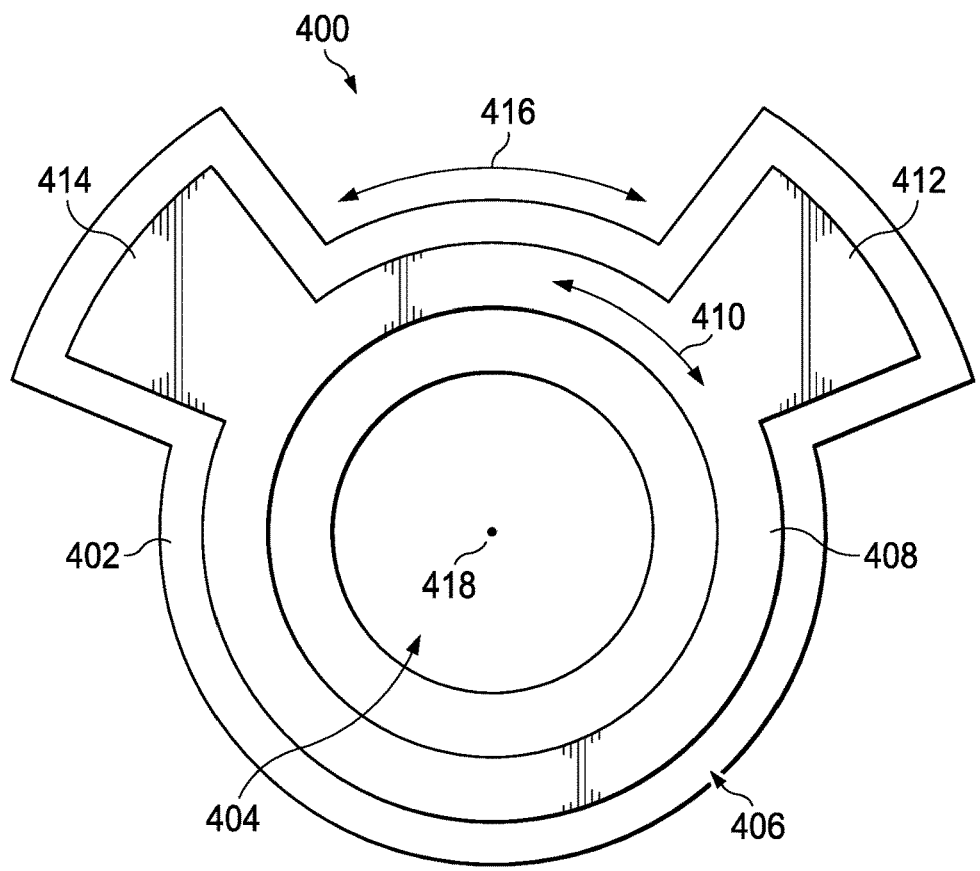
FIG. 4 is a schematic view of an example rotary PCB in accordance with this disclosure.

FIG. 4 is a schematic view of an example rotary PCB 400 that may be used to implement the example rotor PCB assembly 114 of FIG. 1. The rotary PCB 400 includes a substrate 402 constructed of one or more PCB materials. An opening 404 in the substrate 402 can be provided to allow a shaft or other object to extend through the substrate 402 (see, e.g., FIG. 7).

The substrate 402 has a shaped conductor member 406 formed thereon that includes a conductive region 408 arranged about a first concentric area 410. In one example as shown, conductive region 408 is annular and surrounds the opening 404. A pair of lobes or conductors 412, 414 of the conductor member 406 are electrically coupled with the conductive region 408 and extend therefrom. The conductors 412, 414 are centrally positioned on a second concentric area 416 and are angularly separated and offset from each other about a central rotational axis 418 of the rotary PCB 400.

In operation, the rotary PCB 400 rotates relative to the stator PCB 300. When the conductors 412, 414 overlap with respective capacitive sensing regions 308, the respective capacitive sensing regions 308 will have their capacitances modified due to the proximity of the conductor member 406.

Figure 5:
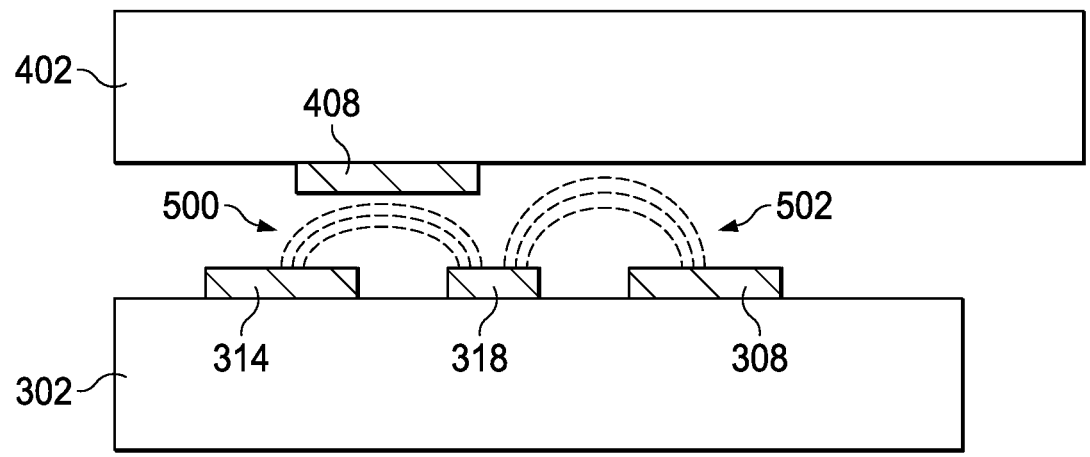
FIG. 5 is a side view of an example portion of the example PCB assembly of FIG. 1 in accordance with this disclosure.

FIG. 5 illustrates the capacitance formed by the capacitive sensing region 308 and ground region 318 formed on the substrate 302 of the stator PCB 300. The ground region 318 is spaced apart from the capacitive sensing region 308 (e.g., not in physical contact, not in electrical contact, etc.) to form an example electric field 500 when a signal is transmitted to and present on the transmit region 314. The conductive region 408, being annular, constantly overlaps the transmit region 314 and the ground region 318. However, the conductors 412, 414 (FIG. 4), being alternately spaced about the second concentric area 416 of the rotary PCB 400, periodically overlap any particular capacitive sensing region 308 as the rotary PCB 400 rotates about its rotational axis 418. In the example illustrated in FIG. 5, none of the conductors 412, 414 is rotationally positioned to overlap the capacitive sensing region 308. Accordingly, the electric field 502 between the capacitive sensing region 308 and the ground region 318 indicates a capacitance value representative of no conductor 412, 414 being adjacent to the capacitive sensing region 308. In one example, the electric field 502 represents a default or baseline capacitance measurable in an initial calibration test.

Figure 6:
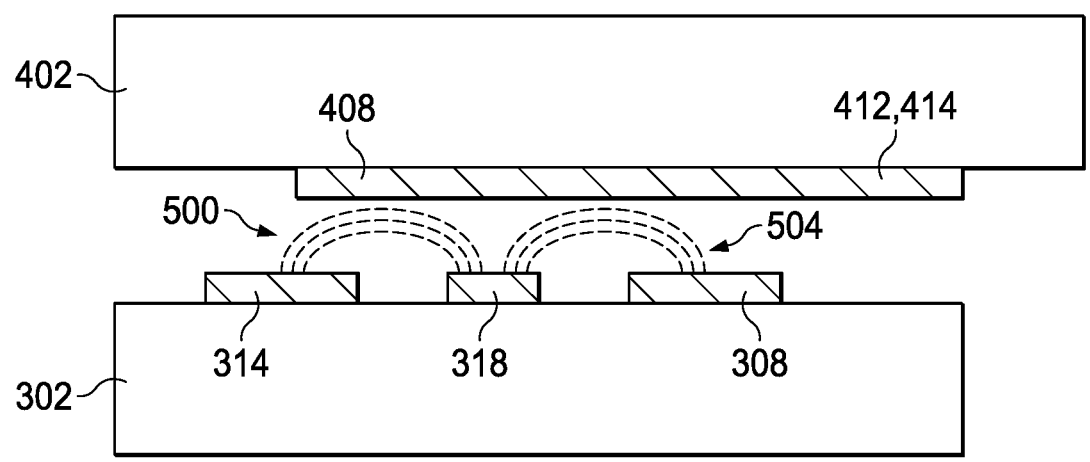
FIG. 6 is a side view of an example portion of the example PCB assembly of FIG. 1 in accordance with this disclosure.

As the rotary PCB 400 rotates, the conductors 412, 414 can move into, through, and out of the electric field 502. When one of the conductors 412, 414 is at least partially above or near the electric field 502 (e.g., proximate to), the conductor 412, 414 interferes with the electric field 502, thereby increasing the capacitance of the capacitive sensing region 308. FIG. 6 illustrates the capacitance formed by the capacitive sensing region 308 and ground region 318 when one of the conductors 412, 414 is adjacent to and overlaps the capacitive sensing region 308. As illustrated, the modified electric field 504 indicates a capacitance value experienced when the capacitive sensing region 308 and the ground region 318 are in close proximity to one of the conductors 412, 414.

The electric fields 500, 502, and 504 illustrated in FIGS. 5 and 6 are formed when a transmit signal is sent to the transmit region 314. Referring back to FIG. 2, an integrated circuit (IC) 218 located on the base 216, for example, includes an output 220 configured to be coupled to the transmit regions 314 of the plurality of stators 214. IC 218, as further described below, sends the transmit signal to the transmit regions 314 to gather capacitance values. The output 220 may include a distinct electrical connection to each transmit region 314 of the plurality of stator 214 or may be implemented in a multiplexing scheme. IC 218 further includes an input 222 coupled to the capacitive sensor arrays 306 of the plurality of stators 214. Like the output 220, the input 222 of the IC 218 may include a distinct electrical connection to each transmit region 314 of the plurality of stators 214 or may be implemented in a multiplexing scheme.

View panel 204, positioned adjacently to the counter assembly 202, allows the counter assembly 202 to be visible through a portion of a housing (not shown) into which the counter assembly 202 is placed. An indicator 224 on the view panel 204 may be aligned with the plurality of number wheels 206 to visibly indicate the number value of the counter assembly 202.

Figure 7:
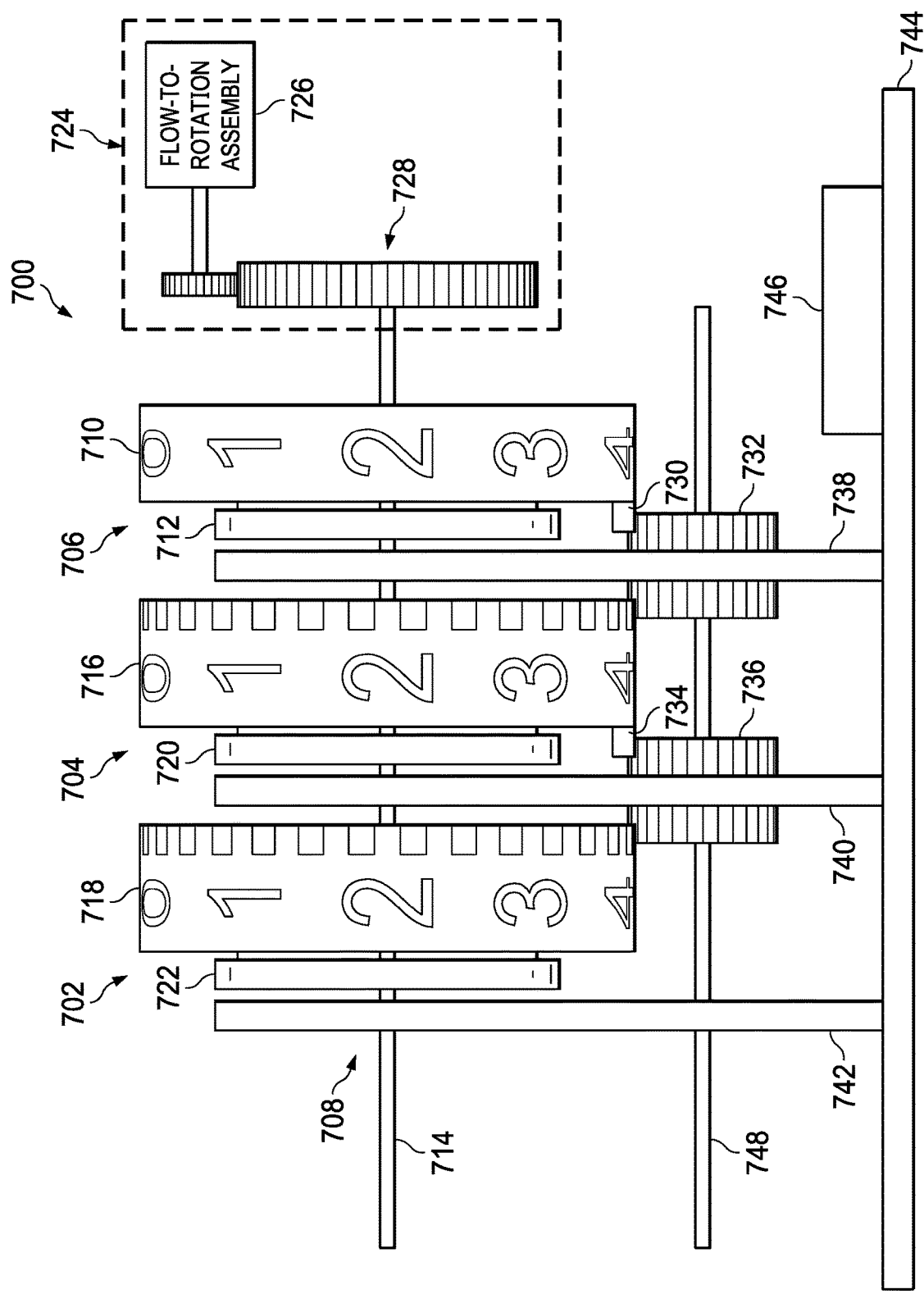
FIG. 7 is a schematic view of a portion of an example flow meter in accordance with this disclosure.

FIG. 7 illustrates a schematic view of portion of an example flow meter assembly 700 in accordance with this disclosure. As illustrated, three number wheel assemblies 702, 704, 706 are assembled together in a counter assembly 708. The number wheel 710 of number wheel assembly 702 is fixedly coupled to a rotary PCB 712, and one or both of the number wheel 710 and the rotary PCB 712 are fixedly coupled to a shaft 714 passing therethrough. Accordingly, the number wheel 710, shaft 714, and rotary PCB 712 rotate in unison. Number wheel assemblies 704, 706 also include respective number wheels 716, 718 fixedly coupled to respective rotary PCBs 720, 722 so that rotation of the number wheel 716 causes the same rotation in the rotary PCB 720 and that rotation of the number wheel assembly 718 causes the same rotation in the rotary PCB 722. The number wheels 716, 718 also include passages or apertures (not shown) formed therein to allow the shaft 714 to pass therethrough. However, unlike the number wheel assembly 702, the number wheels 716, 718 are not fixedly attached to the shaft 714 but are allowed to rotate independently thereof.

A counter driver 724 coupled to the shaft 714 causes the shaft 714 and the number wheel 710 and rotary PCB 712 attached thereto to rotate based on the flow of a fluid or energy through the flow meter assembly 700. A flow-to-rotation assembly 726 may be directly coupled to the shaft 714 or may be coupled via a gear assembly 728, for example. The counter driver 724 is designed to convert the fluid or energy flow into a rotation movement that causes the shaft 714 and, therefore, the first number wheel 710 to rotate. The number wheel 710 includes a gear engagement member 730 configured to cause partial rotation of a gear 732 positioned adjacently to the first and second number wheels 710, 716. Rotation of the gear 732 causes partial rotation of the number wheel 716. Accordingly, each rotation of the number wheel 710 causes a partial rotation in the number wheel 716 via the gear 732. According to one example, ten rotations of the number wheel 710 causes a full rotation of the number wheel 716. Similarly, a gear engagement member 734 on the number wheel 716 engages a gear 736 positioned adjacently to the second and third number wheels 716, 718. According to the example provided herein, ten rotations of the number wheel 716 causes a full rotation of the number wheel 718.

Each number wheel assembly 702, 704, 706 also includes a respective stator PCB 738, 740, 742, each coupled to a substrate 744 having thereon an IC 746 configured to determine the angular rotation of the number wheels 710, 716, 718 based on determining a plurality of capacitance values experienced by the stator PCBs 738, 740, 742. The stator PCBs 738, 740, 742 may also include openings such as opening 304 (FIG. 3) to allow the shaft 714 to pass therethrough. Additionally, openings (not shown) formed to allow gears 732, 736 and their common shaft 748 to pass therethrough may be formed depending on the arrangement.

Figure 8:
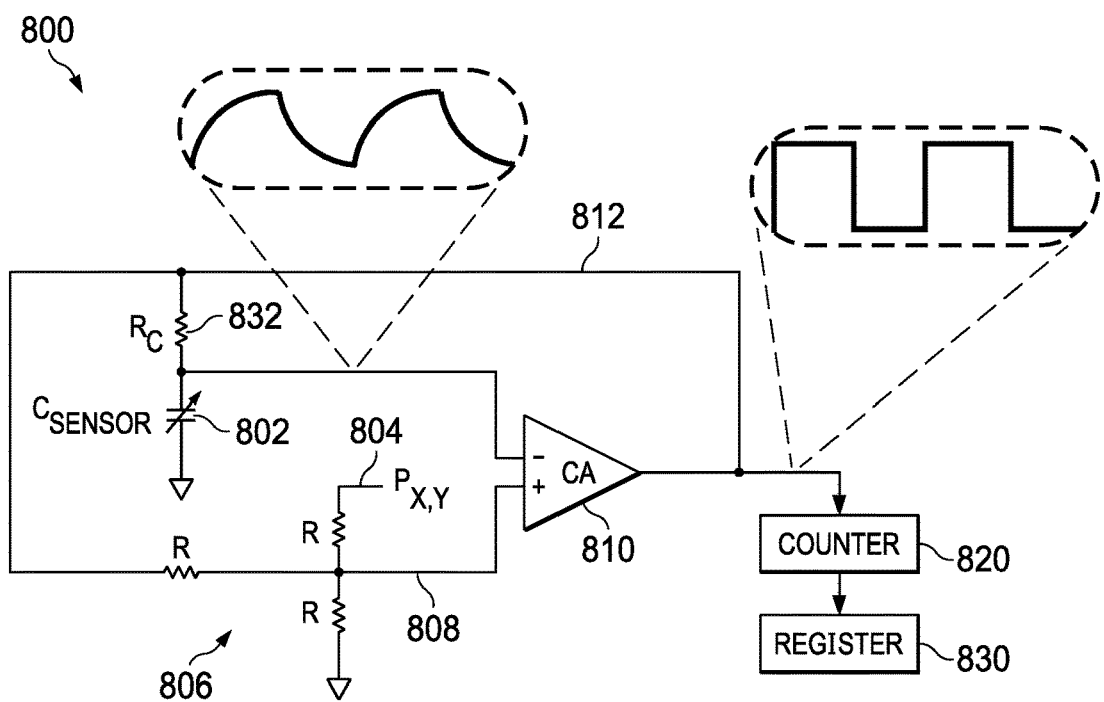
FIG. 8 is a schematic diagram of an example circuit that may be used to implement an example sense circuit of FIG. 1 in accordance with this disclosure.

FIG. 8 is a schematic diagram of an example sense circuit 800 for a combined sensing capacitor 802 for a capacitive sensor array 306 in the form of an oscillator circuit. The example sense circuit 800 may be used to implement an example sense circuit embedded within or otherwise accessible to the IC 218. When a control input 804 is set to a logic high (e.g., equal to a supply voltage Vcc), an example resistor ladder network 806 creates an example reference input 808 for an example comparator 810 that changes with an example output 812 of the comparator 810. The example reference input 808 toggles and has a polarity that is opposite the charge and discharge of the capacitive sensor 802. In the example of FIG. 8, if the resistors R of the resistor ladder network 806 have approximately equal resistances, then the oscillation or cycle frequency $f_{OSC}$ of the output 812 of the comparator 810 can be expressed mathematically as:

$$f_{osc} = 1/(1.386 R_C C_{SENSOR}),$$

where $C_{SENSOR}$ is the capacitance of the capacitive sensor 802, which varies responsive to the proximity of a conductor, such as the example conductor member 406. As discussed above in connection with FIGS. 3-6, as a conductor interferes with the electric field 502, 504, the capacitance of the capacitive sensor 804 increases and, thus, the cycle frequency $f_{OSC}$ of the output 812 of the comparator 810 increases. That is, the cycle frequency $f_{OSC}$ can be used as a measure of the capacitance of the capacitive sensor 802.

To determine (e.g., estimate, measure, etc.) the cycle frequency $f_{OSC}$ of the output signal 812 of the comparator 810, the example sense circuit 800 includes an example counter 820 and the example count register 830. The example counter 820 counts cycles of the output signal 812 by, for example, counting rising or falling edges of the output 812. At periodic intervals, the current cycle count is stored in the example count register 830 for subsequent retrieval, and the counter 820 is reset. The larger the count stored in the count register 830, the higher the cycle frequency $f_{OSC}$ of the output 812, and the larger the capacitance of the capacitive sensor 802, which indicates a larger interference of the capacitive sensor 802 by a conductor.

Figure 9:
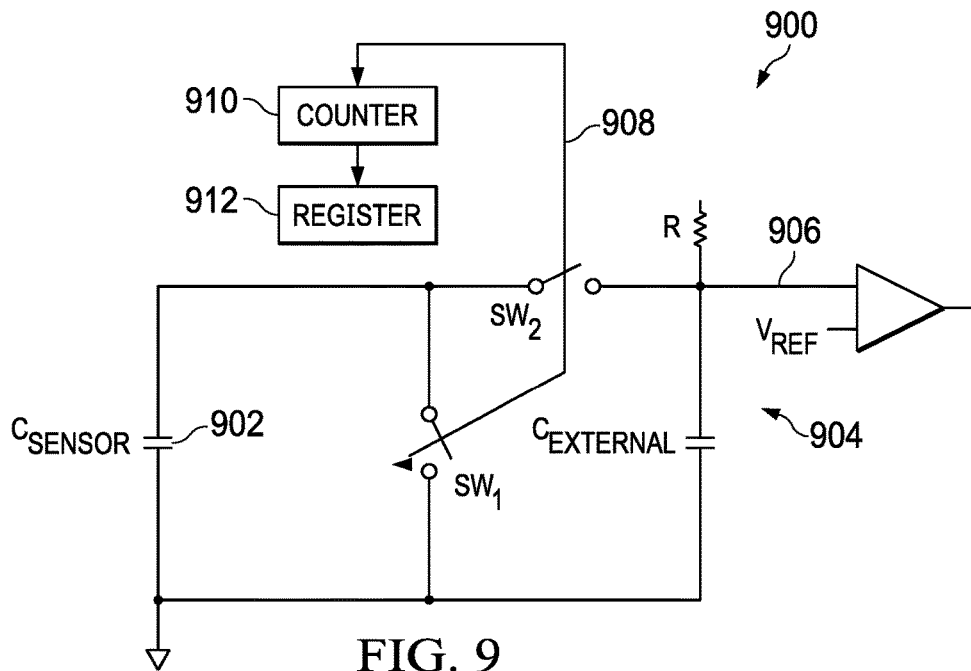
FIG. 9 is a schematic diagram of another example circuit that may be used to implement an example sense circuit of FIG. 1 in accordance with this disclosure.

FIG. 9 is a schematic diagram of another example sense circuit 900 for a combined sensing capacitor 902 for a capacitive sensor array 306 in the form of a charge-transfer circuit. The example sense circuit 900 of FIG. 9 may be used to implement an example sense circuit embedded within or otherwise accessible to the IC 218. In FIG. 9, a resistor-capacitor (RC) network 904 is used to charge a circuit voltage 906. Charge is periodically transferred from the sense capacitor 902 to the RC network 904 by controlling with a signal 908 which controls example switches $SW_1$ and $SW_2$. When a conductor is proximate to the capacitive sensor 902, the capacitance of the capacitive sensor 902 increases, and more charge is transferred from the capacitive sensor 902 to the RC network 904 per cycle of the signal 908. By counting, with a counter 910, the number of cycles of the signal 908 needed for the circuit voltage 906 to exceed a threshold voltage $V_{REF}$, a measure of the capacitance of the capacitive sensor 902 can be determined. At periodic intervals, the current count is stored in an example count register 912 for subsequent retrieval, and the counter 910 is reset. The smaller the count stored in the count register 902, the larger the capacitance of the capacitive sensor 904, which indicates a larger interference of the capacitive sensor 904 by a conductor.

Figure 10:
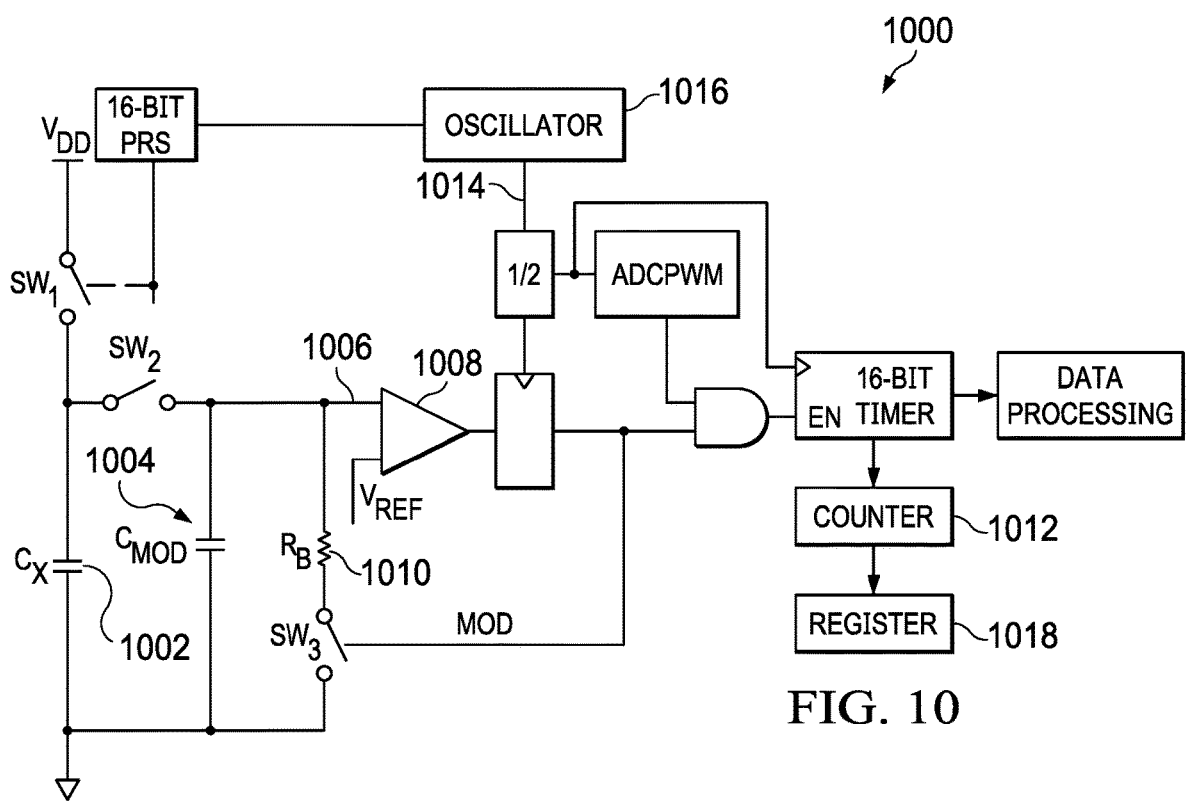
FIG. 10 is a schematic diagram of yet another example circuit that may be used to implement an example sense circuit of FIG. 1 in accordance with this disclosure.

FIG. 10 is a schematic diagram of yet another example sense 1000 for a combined sensing capacitor 1002 for a capacitive sensor array 306 in the form of a sigma-delta sense circuit. The example sense circuit 1000 of FIG. 10 may be used to implement an example sense circuit embedded within or otherwise accessible to the IC 218. In FIG. 10, the capacitive sensor 1002 charges a resistor-capacitor (RC) network 1004 that charges a circuit voltage 1006. When a conductor is proximate to the capacitive sensor 1002, the capacitance of the capacitive sensor 1002 increases, and charge is transferred faster from the capacitive sensor 1002 to the circuit voltage 1006. Once the circuit voltage 1006 exceeds a threshold reference voltage $V_{REF}$, a comparator 1008 is tripped, and discharge of the circuit voltage 1006 through a resistor 1010 begins. As the capacitance of the capacitive sensor 1002 increases, the discharging slows as charging by the capacitive sensor 1002 continues. Counting, with a counter 1012, the number of cycles of an output signal 1014 of an oscillator 1016 until discharging completes, the capacitance of the capacitive sensor 1002 can be determined. At periodic intervals, the current count is stored in an example count register 1018 for subsequent retrieval, and the counter 1012 is reset. The larger the count stored in the count register 1018, the larger the capacitance of the capacitive sensor 1002, which indicates a larger interference of the capacitive sensor 1002 by a conductor.

Figure 11:
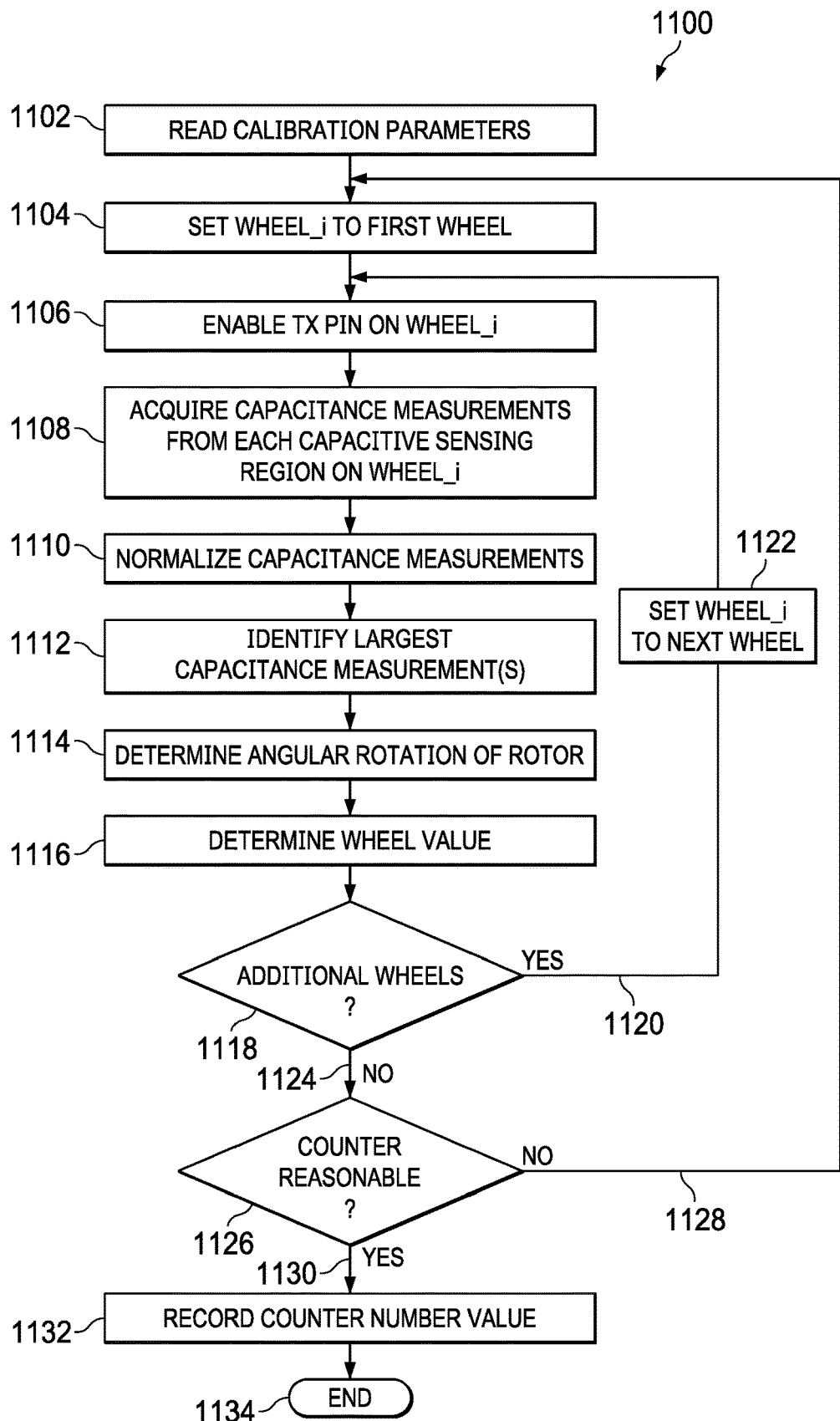
FIG. 11 is a flow diagram of a counter decoding scheme in accordance with this disclosure.

FIG. 11 is a flow diagram of a counter decoding scheme 1100 executable by a microcontroller or IC (e.g., IC 218 of FIG. 2) according to an example. Counter decoding scheme 1100 can be executed to determine the number value of a counter assembly (e.g., counter assembly 108, 202, 708 of FIGS. 1,2, 7) with one or more number wheels. The IC reads calibration parameters (step 1102) from a set of calibrations parameters stored on a computer-readable memory storage device. The calibration parameters may include a lookup table and have default capacitance values for each capacitive sensing region of each stator PCB (e.g., capacitive sensing region 308 of stator PCB 300 of FIG. 3) of the counter assembly. The calibration parameters may be measured and stored during the manufacturing process for the counter assembly, for example, and may include sensed capacitance values for each capacitive sensing region when the rotor conductors (e.g., conductors 412, 414 of FIG. 4) are not overlapping the capacitive sensing region. In addition, the calibration parameters may include sensed capacitance values for each capacitive sensing region when one or both rotor conductors respectively overlap the capacitive sensing region. In this manner, a default or baseline capacitance value for each capacitive sensing region may be stored and used for normalization during the counter decoding scheme 1100 as described below.

The first wheel to be decoded ("decoding wheel") is set (step 1104) and may be a most-significant-digit wheel (e.g., the wheel in the thousands place in a three-digit counter), a least-significant-digit (e.g., the wheel in the ones place in a three-digit counter), or any wheel in between. For the decoding wheel to be decoded, the respective stator corresponding to the decoding wheel is used to acquire capacitance value measurements from its capacitive sensor array. Scheme 1100 enables (step 1106) the transmit ("TX") pin on the stator for the decoding wheel by transmitting a voltage signal from the IC executing the scheme 1100 to the transmit region of the stator. Capacitance measurements are acquired (step 1108) from each capacitive sensing region (e.g., capacitive sensing regions 308 of FIG. 3) on the stator. The capacitance measurements may include determining the capacitance value on each capacitive sensing region as described, for example, in FIGS. 8-10.

Each of the acquired capacitance measurements is normalized (step 1110) based on the calibration parameters. Normalization may include finding a difference between the recently measured capacitance value and the calibrated capacitance value from the calibration parameters. The capacitance measurements are analyzed to identify (step 1112) the largest capacitance value or values. The number of lobes (e.g., conductors) of the conductor member of the rotor indicates the number of large capacitance values that may be identified. In one example, for the embodiments described herein where the dual-lobed conductor member 406 includes the two conductors 412, 414, two largest values may be identified.

The angular rotation or position of the rotor is determined (step 1114) based on the largest identified capacitance value(s). When the rotor has a single conductor lobe, the angular rotation or position of the rotor can be determined to correspond with the position of the capacitive sensing region that sensed the largest value. When the rotor has multiple conductor lobes, multiple capacitive sensing regions sense large capacitance values. In this case, the angular rotation or position of the rotor can be determined based on the angular offset of the capacitive sensing regions that sensed the large values correlated with the angular offset of the multiple conductor lobes. When fixed to a rotating shaft (e.g., shaft 210 of FIG. 2), determination of the angular rotation or position of the rotor is correlated to the angular rotation or position of the shaft. In one example, when the rotor is rotated so that the first conductor (e.g., conductor 412) is aligned with the first capacitive sensing region and the second conductor (e.g., conductor 414) is aligned with the fourth capacitive sensing region, the angle of rotation of the rotor may be known to be a certain value such as 0 degrees. When the first conductor is aligned with the second capacitive sensing region and the second conductor is aligned with the fifth capacitive sensing region, for example, the angle of rotation of the rotor may be known to be 36 degrees. Other rotation angles of the rotor may be likewise known.

A correlation exists between the rotation angle of the rotor and the numbers or symbols on the corresponding decoding wheel based on which number or symbol is indicated when the decoding wheel is rotated to a particular position. Since the rotation of the rotor matches the rotation of the number wheel, determining (step 1116) the wheel value of the decoding wheel includes decoding the number or other symbol on the face of the wheel that is lined up with, for example, a visual indicator (e.g., indicator 224 of FIG. 2) based on the angular rotation or position of the number wheel. For example, if the angular position of the rotor is an angle of 0 degrees, a corresponding angular position of the number wheel at 0 degrees may correspond with a number value of "zero". Similarly, if the angular position of the rotor is an angle of 180 degrees, a corresponding angular position of the number wheel at 180 degrees may correspond with a number value of "five".

Counter decoding scheme 1100 determines (step 1118) whether additional wheels remain to be decoded. If so (1120), the decoding wheel is set (step 1122) to the next wheel to be decoded, and execution returns to step 1106 to decode the next wheel.

If no additional wheels are left to decode (1124), counter decoding scheme 1100 can append all the decoded numbers and determine whether the resulting counter number is reasonable (step 1126). For example, if the counter number is less than a previously decoded number based on a comparison of the current number to a historical log, it may be determined that the current value is not reasonable in an example where a larger number is expected. If the current number is not reasonable (1128), execution of scheme 1100 may return to step 1104 to reevaluate all wheels of the counter assembly. However, if the counter number is reasonable (1130), the counter number value may be recorded (step 1132) into the historical log or other memory location. The counter decoding scheme 1100 may then end (step 1134).

The foregoing description of various preferred embodiments of the invention have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An apparatus comprising:
    a rotary encoder comprising:
        a stator having an opening adapted to surround a first portion of a rotatable shaft, the stator further comprising:
            a transmit region located on a first concentric area of the stator; and
            a receive region located on a second concentric area of the stator, the second concentric area separate from the first concentric area;
        a rotor having an opening adapted to surround a second portion of the rotatable shaft, the rotor further comprising;
            an annular conductive region located on a first concentric area of the rotor; and
            at least one conductor electrically coupled with the annular conductive region and located on a second concentric area of the rotor, the second concentric area separate from the first concentric area; and
        a controller having an input coupled to the receive region and having an output coupled to the transmit region, wherein the controller is configured to:
            transmit a first signal on the output of the controller and to the transmit region of the stator;
            receive a second signal on the input of the controller and from the receive region of the stator; and
            determine, based on the second signal, a proximity of the at least one conductor to the receive region.

2. The apparatus of claim 1, wherein the controller is configured to determine a rotational position of the rotatable shaft based on the proximity of the at least one conductor to the receive region.

3. The apparatus of claim 2, wherein the second signal indicates a capacitance between the at least one conductor of the rotor and the receive region of the stator.

4. The apparatus of claim 1, wherein the receive region of the stator comprises a capacitive sensor array.

5. The apparatus of claim 1, wherein the first concentric area of the stator is closer to the opening of the stator than the second concentric area of the stator.

6. The apparatus of claim 5, wherein the stator further comprises a ground region located on a third concentric area positioned between the first concentric area of the stator and the second concentric area of the stator.

7. The apparatus of claim 5, wherein the first concentric area of the stator is configured to overlap the first concentric area of the rotor; and
    wherein the second concentric area of the stator is configured to overlap the second concentric area of the rotor.

8. The apparatus of claim 1, wherein the at least one conductor of the rotor comprises:
    a first conductor; and
    a second conductor angularly offset from the first conductor about a rotational axis of the rotor.

9. The apparatus of claim 8, wherein the receive region of the stator further comprises a plurality of receive conductors, each receive conductor of the plurality of receive conductors independently coupled with the controller and angularly offset from each other about a central concentric axis of the stator; and
    wherein, when the first conductor is positioned adjacently to a first receive conductor of the plurality of receive conductors and the second conductor is positioned adjacently to a second receive conductor of the plurality of receive conductors, at least a third receive conductor of the plurality of receive conductors is positioned between the first and second receive conductors, along a shortest angular distance between the first and second receive conductors.

10. An apparatus comprising:
    a rotatable shaft;
    a rotor coupled to a first portion of the rotatable shaft and comprising:

a central region located on a first concentric area of the rotor; and at least one lobe coupled to and extending from the central region, the at least one lobe located on a second concentric area of the rotor;

a fixed substrate positioned adjacently to the rotor and having an opening surrounding the rotatable shaft, the fixed substrate comprising:

a transmit region configured to capacitively couple with the central region; and a capacitive sensor array configured to capacitively couple with the at least one lobe; and a controller electrically coupled with the transmit region and with the capacitive sensor array and configured to:

receive an output from the capacitive sensor array based a signal transmitted to the transmit region; and determine an angular rotation of the rotor based on the output.

11. The apparatus of claim 10, wherein a substrate of the rotor comprises printed circuit board (PCB) material; and wherein the capacitive sensor array comprises copper formed on a surface of the PCB material.

12. The apparatus of claim 10, wherein the capacitive sensor array comprises a plurality of receive conductors arranged about a first concentric area of the fixed substrate; and wherein the transmit region is arranged about a second concentric area of the fixed substrate.

13. The apparatus of claim 12, wherein the controller, in being configured to determine the angular rotation, is configured to:

determine a capacitance value between each receive conductor of the plurality of receive conductors and the rotor;

correlate at least one receive conductor of the plurality of receive conductors with the at least one lobe based on the determined capacitance values; and determine the angular rotation of the rotor based on an angular position of the at least one receive conductor and an angular position of the at least one lobe.

14. The apparatus of claim 13, wherein the controller is further configured to:

acquire a calibration parameter for the at least one receive conductor from a set of calibration parameters; and determine a difference between the calibration parameter and the output from the capacitive sensor.

15. The apparatus of claim 12 further comprising:

a number wheel coupled to the rotor; and a flow meter configured to allow an amount of one of a fluid and an energy to flow therethrough and to rotate the number wheel based on the amount flowing through the flow meter.

16. The apparatus of claim 15, wherein the flow meter further comprises an indicator aligned with the number wheel; and wherein the controller, in being configured to determine the angular rotation, is configured to:

determine a capacitance value between each receive conductor of the plurality of receive conductors and the rotor;

correlate at least one receive conductor of the plurality of receive conductors with the at least one lobe based on the determined capacitance values;

determine the angular rotation of the rotor based on an angular position of the at least one receive conductor and an angular position of the at least one lobe; and correlate the angular rotation of the rotor with a number value of the number wheel aligned with the indicator.

17. A controller configured to:

transmit a first signal to a transmit region of a stator, wherein the transmit region is located on a first concentric area of the stator;

receive a second signal from a receive region of the stator, wherein:

the receive region is located on a second concentric area of the stator;

the second signal is based on an interaction of the first signal with a conductor member formed on a rotor positioned adjacently to the stator; and wherein the conductor member comprises at least one conductor lobe; and determine, based on the second signal, a proximity of the at least one conductor lobe to the receive region.

18. The controller of claim 17, wherein the controller, in being configured to determine the proximity of the at least one conductor lobe to the receive region, is configured to determine a capacitance between the at least one conductor lobe and the receive region.

19. The controller of claim 18, wherein the receive region comprises a plurality of receive conductors arranged about the first concentric area; and wherein the controller, in being configured to determine a capacitance between the at least one conductor lobe and the receive region, is configured to:

determine a capacitance value between each receive conductor of the plurality of receive conductors and the conductor member; and correlate at least one receive conductor of the plurality of receive conductors with the at least one conductor lobe based on the determined capacitance values.

20. The controller of claim 19, wherein the controller is further configured to determine an angular rotation of the rotor based on an angular position of the correlated at least one receive conductor.

* * * * *